United States Patent
Mallinson

(10) Patent No.: US 10,236,850 B2
(45) Date of Patent: Mar. 19, 2019

(54) SIGNAL PROCESSOR USING MULTIPLE FREQUENCY BANDS

(71) Applicant: ESS Technology, Inc., Milpitas, CA (US)

(72) Inventor: A. Martin Mallinson, Kelowna (CA)

(73) Assignee: ESS Technology, Inc., Milpitas, CA (US)

( * ) Notice: Subject to any disclaimer, the term of this patent is extended or adjusted under 35 U.S.C. 154(b) by 0 days.

(21) Appl. No.: 15/620,084

(22) Filed: Jun. 12, 2017

(65) Prior Publication Data

US 2017/0366151 A1 Dec. 21, 2017

Related U.S. Application Data

(60) Provisional application No. 62/350,542, filed on Jun. 15, 2016.

(51) Int. Cl.
*H03G 3/30* (2006.01)
*H03G 3/32* (2006.01)
(Continued)

(52) U.S. Cl.
CPC ........... *H03G 5/165* (2013.01); *H03G 3/3005* (2013.01); *H03G 5/025* (2013.01); *H03G 5/24* (2013.01);
(Continued)

(58) Field of Classification Search
CPC ...... H03G 5/165; H03G 3/3005; H03G 7/007; H03G 7/002; H03G 9/025; H03G 5/24;
(Continued)

(56) References Cited

U.S. PATENT DOCUMENTS

| 5,134,658 | A | * | 7/1992 | Chen | ...................... | H04M 9/085 |
| | | | | | | 381/110 |
| 5,444,788 | A | * | 8/1995 | Orban | ..................... | H03G 7/002 |
| | | | | | | 333/14 |

(Continued)

FOREIGN PATENT DOCUMENTS

GB 2461280 A * 12/2009 ........... H04B 1/0007

*Primary Examiner* — Davetta W Goins
*Assistant Examiner* — Kuassi A Ganmavo
(74) *Attorney, Agent, or Firm* — Gard & Kaslow LLP

(57) ABSTRACT

A circuit and method is disclosed for filtering an audio signal. The circuit has a first quadrature source and multipliers for multiplying the input signal by the I and Q outputs of the quadrature source. The multiplied inputs are then passed through a pair of low pass filters, which may have an adjustable Q factor. The outputs of the low pass filters are then multiplied in a second pair of multipliers by the I and Q outputs, respectively, of a second quadrature source, which will typically be of the same frequency, but different amplitude and phase, of the first quadrature source. The twice-multiplied signals are then summed by an adder to provide an output signal. The circuit may be modified to include a companding circuit between the low pass filters and the second pair of multipliers that determines the amplitude of the input signal, filters it, and compands the signal in a compandor. The compandor may have adjustable parameters. The circuit thus allows for far greater flexibility and control of the processing of the input signal than prior art circuits.

10 Claims, 16 Drawing Sheets

300

(51) Int. Cl.
*H03G 5/00* (2006.01)
*H03G 5/02* (2006.01)
*H03G 5/16* (2006.01)
*H03G 5/24* (2006.01)
*H03G 9/02* (2006.01)
*H03G 9/18* (2006.01)
*H04R 3/00* (2006.01)
*H04R 3/04* (2006.01)

(52) U.S. Cl.
CPC ............... *H03G 9/025* (2013.01); *H03G 9/18* (2013.01); *H03G 3/32* (2013.01); *H03G 5/005* (2013.01); *H04R 3/007* (2013.01); *H04R 3/04* (2013.01)

(58) Field of Classification Search
CPC . H03G 9/18; H03G 3/32; H03G 5/005; H04R 3/04; H03F 1/307; H03F 2200/271
See application file for complete search history.

(56) References Cited

U.S. PATENT DOCUMENTS

| | | | | |
|---|---|---|---|---|
| 5,521,548 | A * | 5/1996 | Sugawara | H03D 3/009 327/350 |
| 5,701,106 | A * | 12/1997 | Pikkarainen | H04L 27/20 332/100 |
| 5,926,065 | A * | 7/1999 | Wakai | H03D 3/006 329/304 |
| 6,137,826 | A * | 10/2000 | Boesch | H03C 3/40 375/146 |
| 7,199,675 | B2 * | 4/2007 | Lee | H03B 27/00 331/117 FE |
| 7,349,491 | B2 * | 3/2008 | Mallinson | H03H 17/027 375/295 |
| 9,485,043 | B1 * | 11/2016 | Modafferi | H04H 20/88 |
| 2009/0113504 | A1 * | 4/2009 | Jackson | H04N 7/102 725/114 |

* cited by examiner

SIGNAL PROCESSOR USING MULTIPLE FREQUENCY BANDS

This application claims priority from Provisional Application No. 62/350,542, filed Jun. 15, 2016, which is incorporated by reference herein in its entirety.

FIELD OF THE INVENTION

The present invention relates generally to signal processing, and more particularly to graphic equalizers and compandors.

BACKGROUND OF THE INVENTION

It is now common for people to listen to music using mobile devices such as smartphones or other mobile media players (collectively "smartphones"). Users have rapidly become accustomed to having music or other audio played back through such devices, and often tend to have their smartphones with them at all times. In some instances, users may wish to play the audio through loudspeakers rather than through headphones.

Due to the small size of smartphones, loudspeakers contained within a smartphone must also be small. There are a also number of small and portable external loudspeakers available that may be used to reproduce the audio output from a smartphone; such external loudspeakers may be connected to a smartphone by, for example, a physical connection such as a wire or by a wireless connection such as Bluetooth, a known wireless technology standard.

In some instances, a smartphone may have the capability of applying an equalizer to the audio output; the equalizer is a circuit that allows for adjustment of the balance between frequency components of the audio signal, and thus the frequency response of the loudspeaker(s). In some cases, the equalizer may have preset functionality, while in other cases the it may be a graphic equalizer that allows the user to see a visual representation of the frequency response and adjust it using "sliders" that can alter the response in different frequency bands. Equalization may be done for various reasons, including satisfying the user's particular aesthetic preferences for, for example, more or less bass or treble in the reproduced audio.

Smartphones may also include compandors (also known as a compander). A compandor is a circuit for compressing or expanding a signal or some portion thereof. In smartphones, they often have two different purposes. One purpose is to protect the loudspeakers from damage when the loudspeaker temperature is too high, or from signals that are too large at a resonant frequency of the loudspeaker. Signals that are too large many cause the diaphragm of the speaker to exceed its maximum displacement or excursion limit. Another purpose is to adjust the output level to make the audio more pleasing to the user by increasing the output level of quiet signals and decreasing the output level of very loud signals.

SUMMARY OF THE INVENTION

A novel circuit is described for processing a streaming audio input signal in continuous time. A portion of an input signal in a selected frequency band is filtered, amplified or suppressed, allowing for use of the circuit as one channel of an equalizer, or as a compandor for the selected frequency band.

One embodiment discloses a method of processing an audio input signal, comprising: multiplying the input signal by I and Q outputs of a first quadrature source; passing the input signal multiplied by the I output of the first quadrature source through a first low pass filter and the input signal multiplied by the Q output of the first quadrature source through a second low pass filter; multiplying an output of the first low pass filter by an I output of a second quadrature source and an output of the second low pass filter by a Q output of the second quadrature source, the second quadrature source having a different phase and amplitude than the first quadrature source, but the same frequency; and summing the outputs of the low pass filters multiplied by the outputs of the second quadrature source to provide an output signal.

An embodiment of this method further comprises: companding the outputs of the first and second low pass filters and providing a resulting companded signal as an input to the second quadrature source.

A still further embodiment of this method further comprises: creating an amplitude signal representing the amplitude of the input signal; filtering the amplitude signal; companding the filtered amplitude signal using a non-linear gain function; and providing the companded signal as an input to the second quadrature source.

Another embodiment discloses an apparatus for processing an audio input signal, comprising: a first quadrature source producing I and Q outputs; first and second multipliers for multiplying the input signal by the I and Q outputs of the first quadrature source, respectively; first and second low pass filters for filtering the input signal multiplied by the I output of the quadrature source and the input signal multiplied by the Q output of the quadrature source, respectively; a second quadrature source producing I and Q outputs; third and fourth multipliers for multiplying an output of the first low pass filter by the I output of the second quadrature source and an output of the second low pass filter by the Q output of the second quadrature source, the second quadrature source having a different phase and amplitude than the first quadrature source, but the same frequency; and an adder for summing the outputs of the low pass filters multiplied by the outputs of the second quadrature source to provide an output signal.

An embodiment of this apparatus further comprises: a circuit for companding the outputs of the first and second low pass filters and providing a resulting companded signal as an input to the second quadrature source.

A further embodiment of this apparatus further comprises: fifth and sixth multipliers for multiplying outputs from the first and second low pass filters by themselves to provide an amplitude signal representing the amplitude of the input signal; a third filter for filtering the amplitude signal; a compandor for companding the filtered amplitude signal using a non-linear gain function.

DETAILED DESCRIPTION OF THE INVENTION

Described herein is a circuit and method whereby a streaming audio input signal is processed in continuous time. A portion of an input signal in a selected frequency band is filtered, allowing for use of the circuit as one channel of an equalizer, or as a compandor for the selected frequency band. Multiple circuits may be used to construct an equalizer or a multi-band compandor.

The circuit has a first quadrature source and multipliers for multiplying the input signal by the I and Q outputs of the quadrature source. The multiplied inputs are then passed through a pair of low pass filters, which may have an adjustable Q factor. The outputs of the low pass filters are then multiplied in a second pair of multipliers by the I and Q outputs, respectively, of a second quadrature source, which will typically be of the same frequency, but different amplitude and phase, of the first quadrature source. The twice-multiplied signals are then summed by an adder to provide an output signal.

The circuit may also be modified to include a companding circuit between the low pass filters and the second pair of multipliers that determines the amplitude of the input signal, filters it, and compands the signal in a compandor. The compandor may have adjustable parameters. The circuit thus allows for far greater flexibility and control of the processing of the input signal than prior art circuits.

Figure 1:
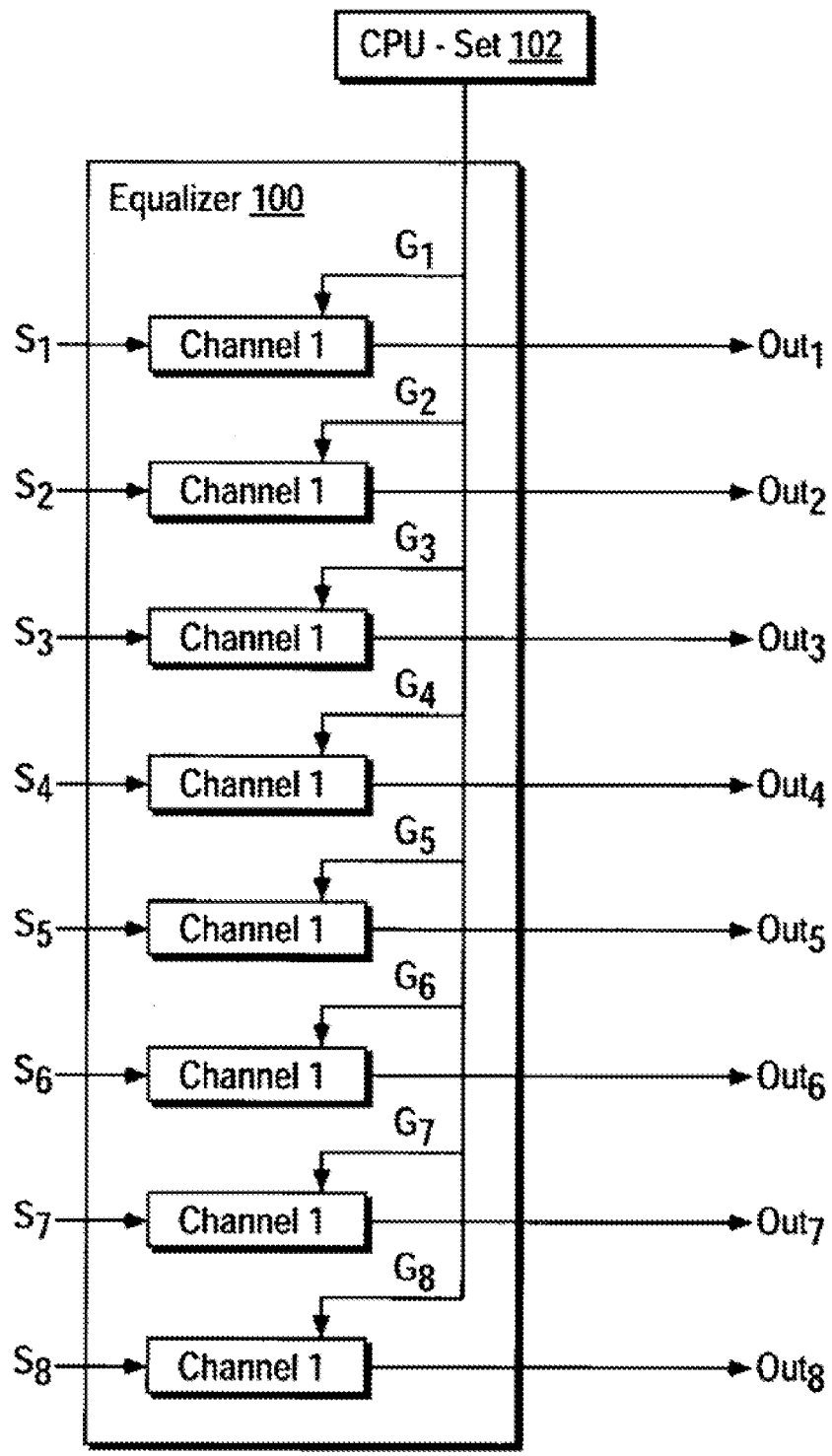
FIG. 1 is a block diagram of a typical equalizer composed of a plurality of channels, according to the prior art.

FIG. 1 is a block diagram of a typical equalizer of the prior art. Equalizer 100 is composed of a series of channels 1 to 8 as illustrated. Each channel includes a signal processor having a gain input $G_i$ and a signal input $S_i$. In some embodiments, the signal processors are stream signal processors (SSPs) that perform operations on each sample of the input signal, rather than operating on a number of samples at once in a batch mode.

In some embodiments, a CPU 102 is included which does not process the signal, but only sets the gain of the circuit by sending a gain setting signal to gain inputs $G_1$ through $G_8$. The equalizer thus processes the stream signal without requiring software to process the incoming signals $S_1$ through $S_8$. Each of the gain inputs receives a control signal from CPU 102 that sets the amplitude response to the circuit. These are represented as the gain "sliders" of the equalizer. The gain may be preset, or may be set by a user of the system by equalizer adjust control knobs or slide switches (also known as sliders). The outputs, $Out_1$ through $Out_8$, are thus configured to transmit an output signal from each of the SSP channels 1 to 8.

Figure 2:
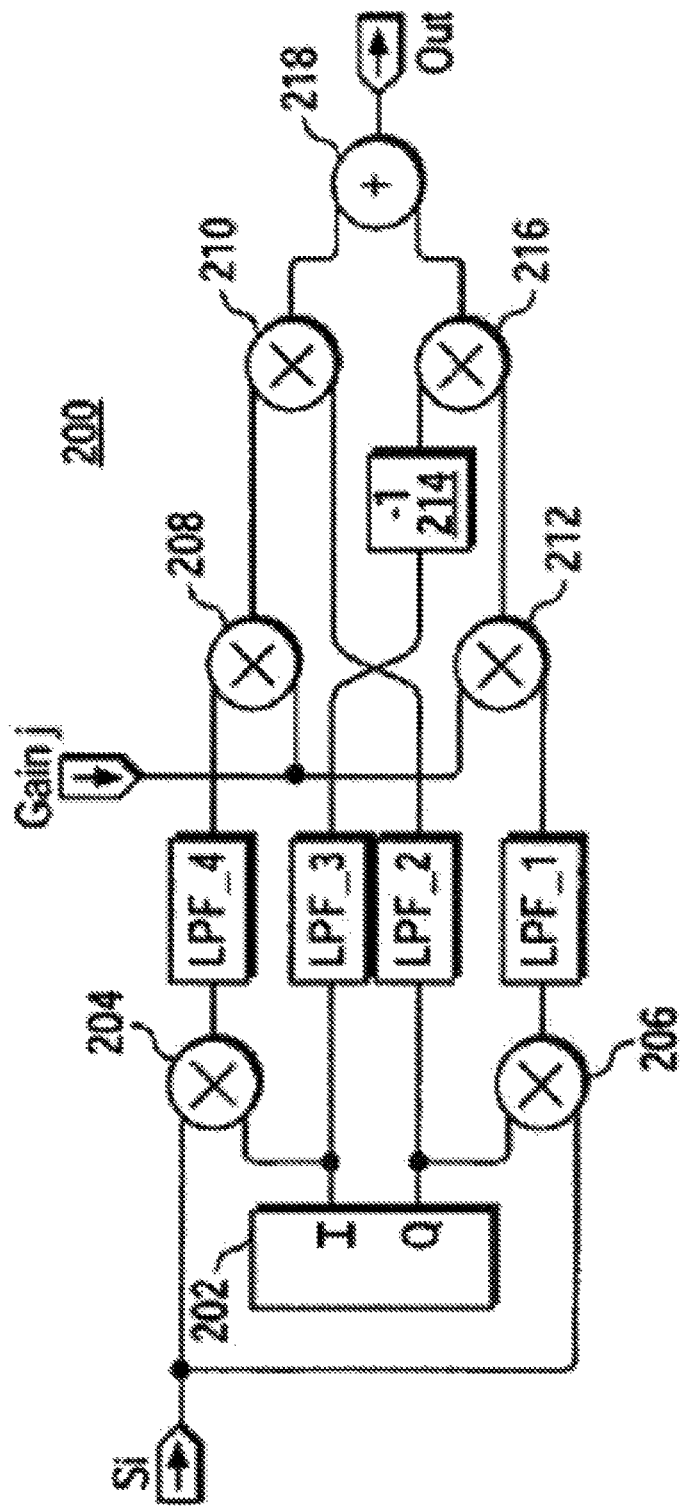
FIG. 2 is a block diagram of a type of circuit that may be used as one channel of an equalizer, such as that of FIG. 1, according to the prior art.

FIG. 2 is a block diagram of a circuit 200 that may be used as one of channels 1 to 8 of FIG. 1, as described in U.S. Pat. No. 7,349,491 ("the '491 patent"); in the '491 patent, circuit 200 is an SSP. Circuit 200 includes an input signal $S_i$ and an output $Out_i$, and operates to calculate the correlation of the input signal $S_i$ with a quadrature source. The term "quadrature source" is known in the art and refers to two sinusoidal signals out of phase by 90 degrees (i.e., so called "in quadrature"). The two signals from a quadrature source are commonly named the "I" signal and the "Q" signal.

Quadrature source 202 is connected to multipliers 204 and 206 and to the low pass filters (LPF) LPF_2 and LPF_3 to provide a reference signal at the channel center frequency. The low pass filters LPF_1 and LPF_4 establish the band pass width of the channel. The multipliers 204 and 206 multiply the incoming signal by the respective outputs, I and Q, of quadrature source 202, and output the result to LPF_1 and LPF_4, respectively. The gain control $Gain_i$ attenuates the channel signal according to the gain input from the CPU or the user controls.

The attenuated signal is re-modulated back to the base band by the final set of modulators 210 and 216. The output of LPF_4 is multiplied by the gain input $Gain_i$ in multiplier 208. The output of multiplier 208 is then multiplied by the output of LPF_2 in multiplier 210. Similarly, the output of multiplier 206 is input to LPF_1, and the output of LPF_1 is multiplied by the gain signal $Gain_i$ in multiplier 212.

The output signal from LPF_3 is inverted 90 degrees by inverter 214, and the output 212 is then multiplied by the inverted output of LPF_3 in multiplier 216. This operation compensates for the lack of suppression of the alias signal out of the modulator. (Commonly, the output of a quadrature source such as described here requires a filter to suppress the harmonics that are generated by the action of multiplying the oscillator signal and the input signal.) The resulting remodulated outputs of multipliers 210 and 216 are then added together in adder 218 to give the channel output Out.

It may be considered that circuit 200 "analyzes" the incoming input signal, filters it, and then "resynthesizes" it as an output signal such that the output signal differs from the input signal but is based upon it in a desired and predictable way.

Figure 3:
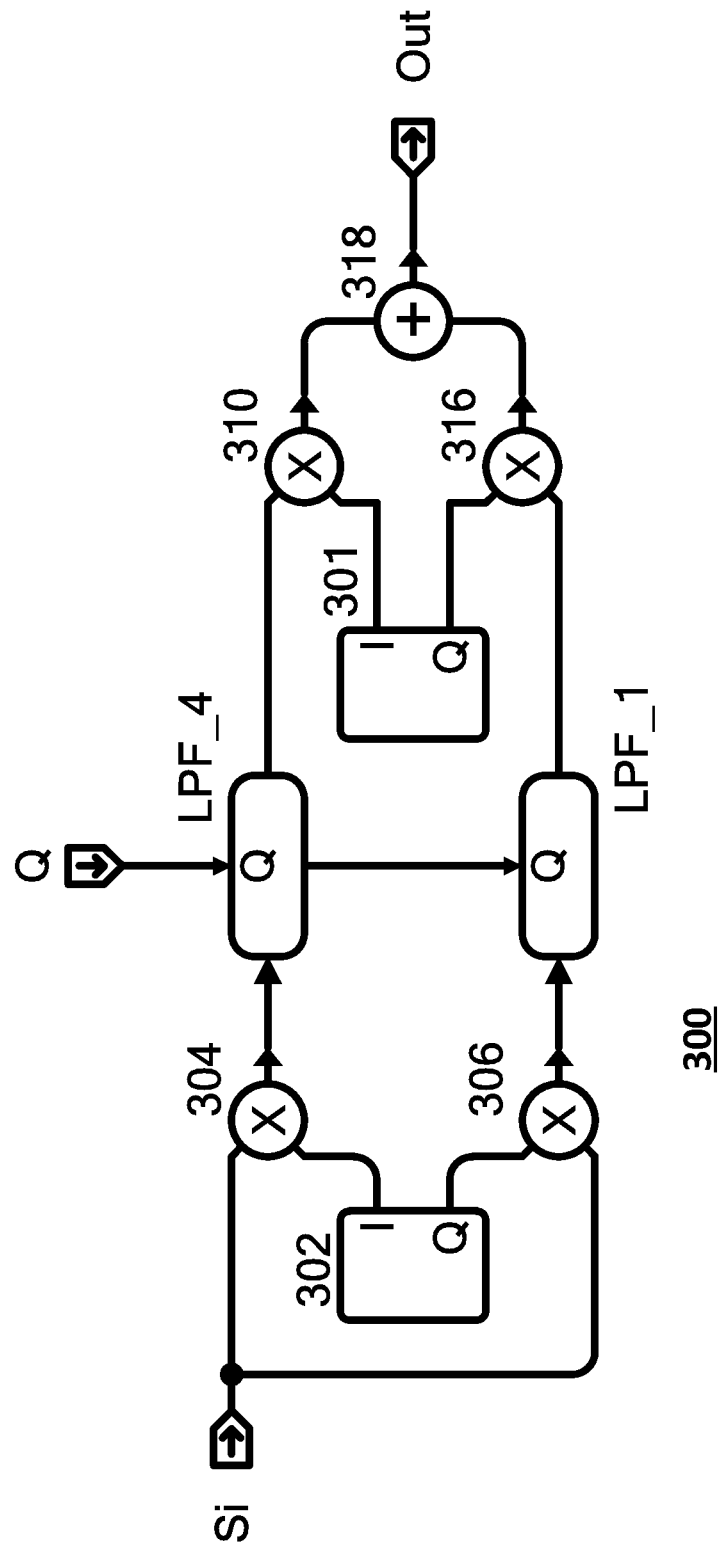
FIG. 3 is block diagram of a circuit that may be used as one channel of an equalizer according to one embodiment.

FIG. 3 is a block diagram of a circuit 300 according to one embodiment of the present approach that similarly analyses and resynthesizes an input signal, and may similarly be used as one of the channels in a graphic equalizer, such as channels 1 to 8 of FIG. 1. Some of the elements of circuit 300 are the same as those of circuit 200. Again there is an input signal Si and an output Outi, and multipliers 304 and 306 that multiply the incoming signal by the respective outputs, I and Q, of a quadrature source 302, and output the result to low pass filters LPF_1 and LPF_4, respectively.

However, in circuit 300, various changes from circuit 200 are made that are not believed to be present in the prior art. Low pass filters LPF_2 and LPF_3 and inverter 214 are replaced with a second quadrature source 301. Quadrature source 301 provides its I and Q signals at a different amplitude and/or phase from quadrature source 302. This provides the amplitude and phase shift that are provided by LPF_2 and LPF_3 in circuit 200. The frequency of quadrature source 301 may be different from that of quadrature source 302, but as will be discussed further below will generally be of the same frequency as quadrature source 302. While the prior art does show the use of two quadrature sources, for example, in the traditional Weaver architecture for changing the frequency band of a signal, in such cases the two quadrature sources are of different frequencies, rather than of the same frequency.

Because the output amplitude of quadrature source 301 may be modified, this replaces the functionality of multipliers 208 and 212 and gain input $Gain_1$ of circuit 200 and those components are no longer necessary. Multipliers 310 and 316 now multiply the outputs of low pass filters LPF_1 and LPF_4 by the I and Q signals, respectively, from quadrature source 301.

In addition, in circuit 300, low pass filters LPF_1 and LPF_4 are provided with "Q control" inputs that allow the bandwidth of the filter relative to the center frequency, known as the Q-factor, to be modified. This allows for the provision of deliberate overshoot or dampening in these filters during operation, rather than having the filters be set to a specific Q-factor in advance as in the prior art.

As with circuit 200, circuit 300 provides for the summation of the low pass filter outputs while preserving the phase information of the original signal. For example, consider the situation in which quadrature source 302 generates a 1 kilohertz (KHz) signal while the input signal Si is a signal of 900 hertz (Hz). The outputs from multipliers 304 and 306 are then a signal at the sum and difference of 1 KHz and 900 Hz, respectively, i.e., they are signals with 100 Hz and 1.9 KHz components.

The low pass filters LPF_4 and LPF_1 remove the 1.9 KHz components and present only the 100 Hz components of the respective signals to the second set of multipliers 310 and 316. These 100 Hz components are multiplied by the outputs of the second quadrature source 301, which are also at 1 KHz, and thus, when summed, re-create a 900 Hz signal at the output. Thus, it can be seen that a 900 Hz signal entering the system at Si results in a 900 Hz signal leaving the system at Out. A signal of 900 Hz is thus within the band of this quadrature resolver, and the phase difference of the filtered output of LPF_4 and LPF_1 combined with the phase difference of the second quadrature oscillator has reproduced the signal.

Figure 4:
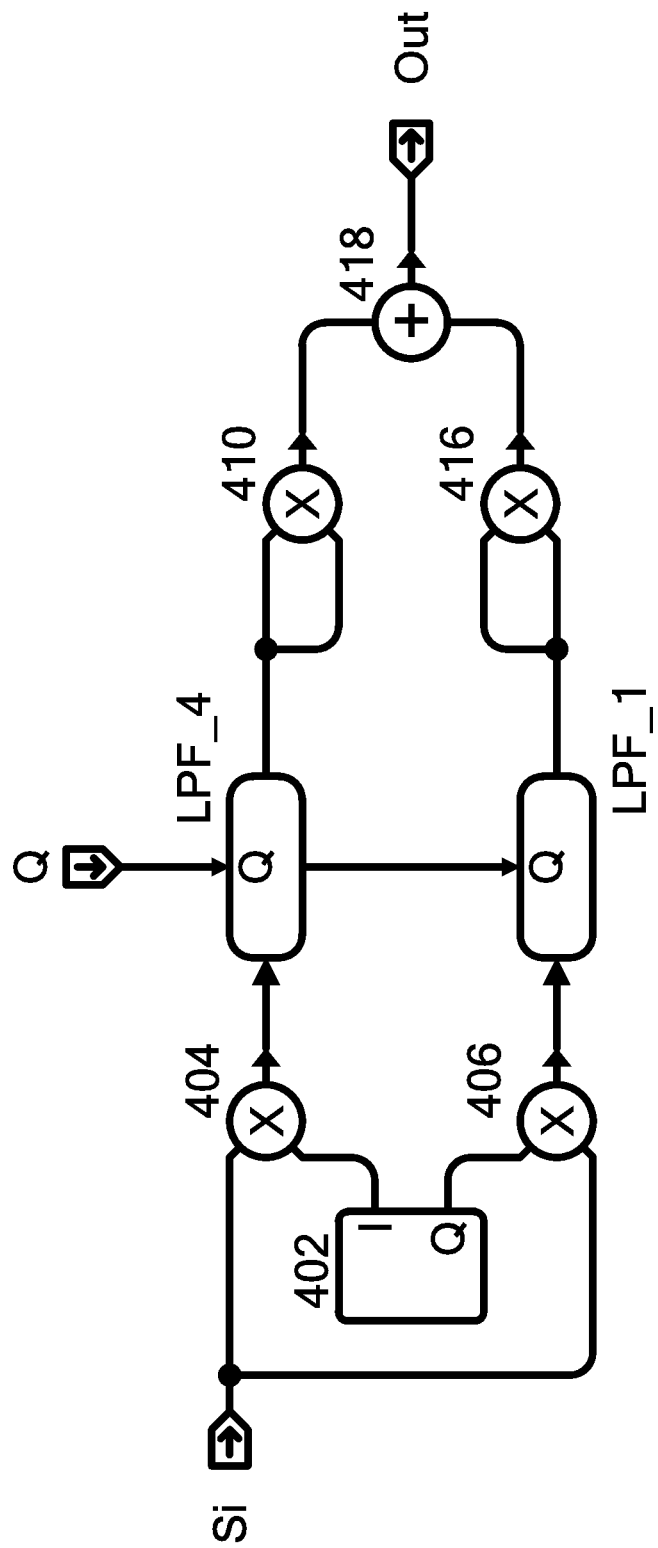
FIG. 4 is a block diagram of a circuit that provides a signal representative of the amplitude of the signal in the frequency band in one embodiment.

Circuit 300 may also be modified further to provide an additional function. FIG. 4 is a block diagram of a circuit 400 that allows for the filtered components of the input signal to be summed in a scalar manner to provide a signal representative of the amplitude of the signal in the frequency band processed by the circuit (which as above is set by low pass filters LPF_4 and LPF_1) in one embodiment.

It is often useful to determine the amplitude of a signal. One of skill in the art will appreciate that it can be difficult to do so accurately, particularly when a signal is composed of varying frequencies. Since any given component is a sinusoidal wave, its amplitude is zero at multiple points which can mean that the accuracy of a measurement of the amplitude of a signal can depend upon the specific instant at which the measurement is taken.

In circuit 400 this problem is addressed by removing the second quadrature source 301 from circuit 300, and instead squaring the two components of the input signal provided by low pass filters LPF_4 and LPF_1 by multiplying each component by itself in multipliers 410 and 416, respectively. The two squared components are then summed by adder 418. As is known in the art, the sum of the squares of the output of low pass filters LPF_4 and LPF_1 is the square of the amplitude of the signal in the frequency band of circuit 400. The use of this principle and circuit will be explained further below.

Figure 5:
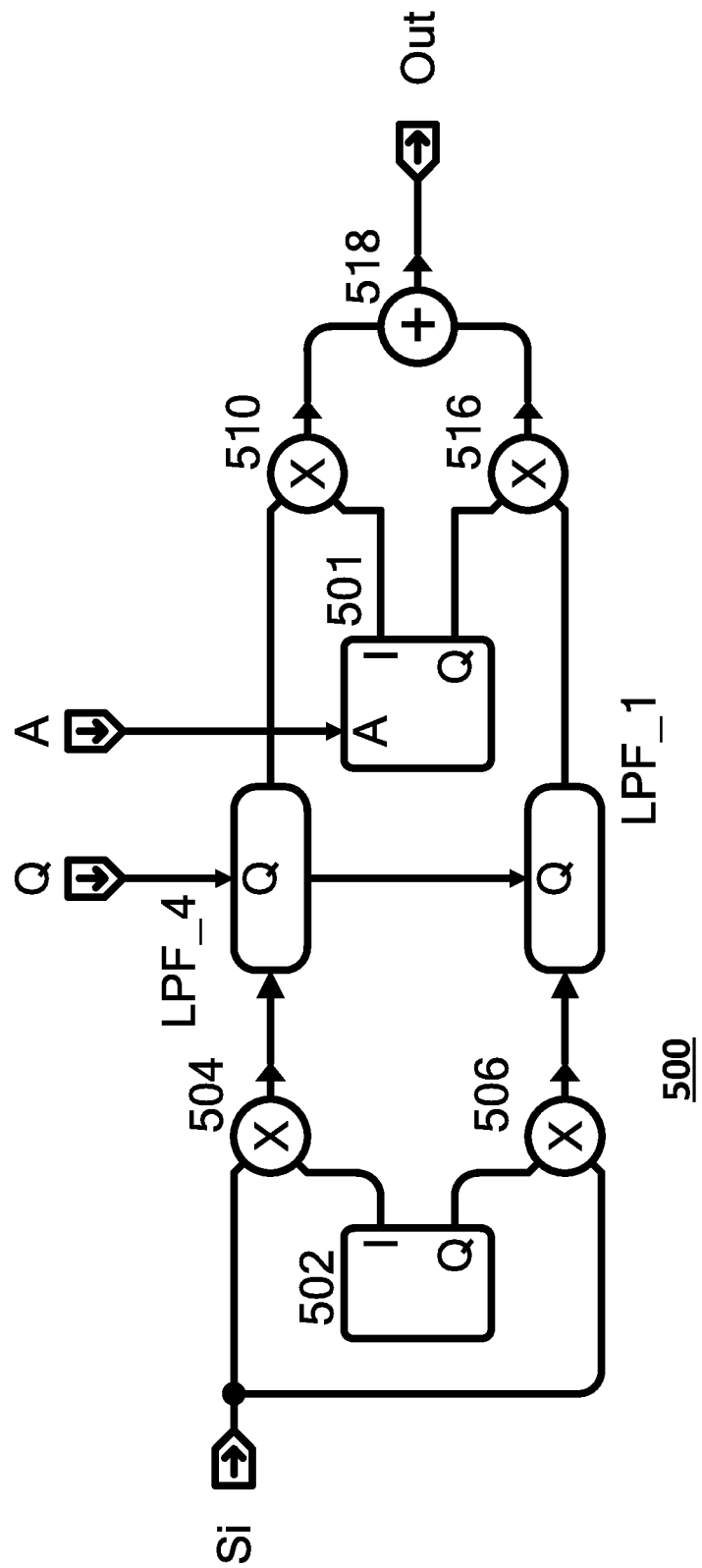
FIG. 5 is a block diagram of a circuit that may be used as one channel of an equalizer in which the amplitude of the re-synthesized signal may be controlled in one embodiment.

FIG. 5 is a block diagram of a circuit 500 in which the amplitude of the output signal may be controlled in one embodiment. Circuit 500 is the same as circuit 300 of FIG. 3 except that the second quadrature source 501 now accepts a signal A that controls the amplitude of the I and Q signals from second quadrature source 501. By altering the amplitude of the output of second quadrature source 501, the amplitude of the re-synthesized signal Out is controlled. As in circuit 300 of FIG. 3, the signals from second quadrature source 501 are then multiplied by the signals from low pass filters LPF_1 and LPF_4 in multipliers 510 and 516, and then summed in adder 518 to obtain the output signal Out.

Figure 6:
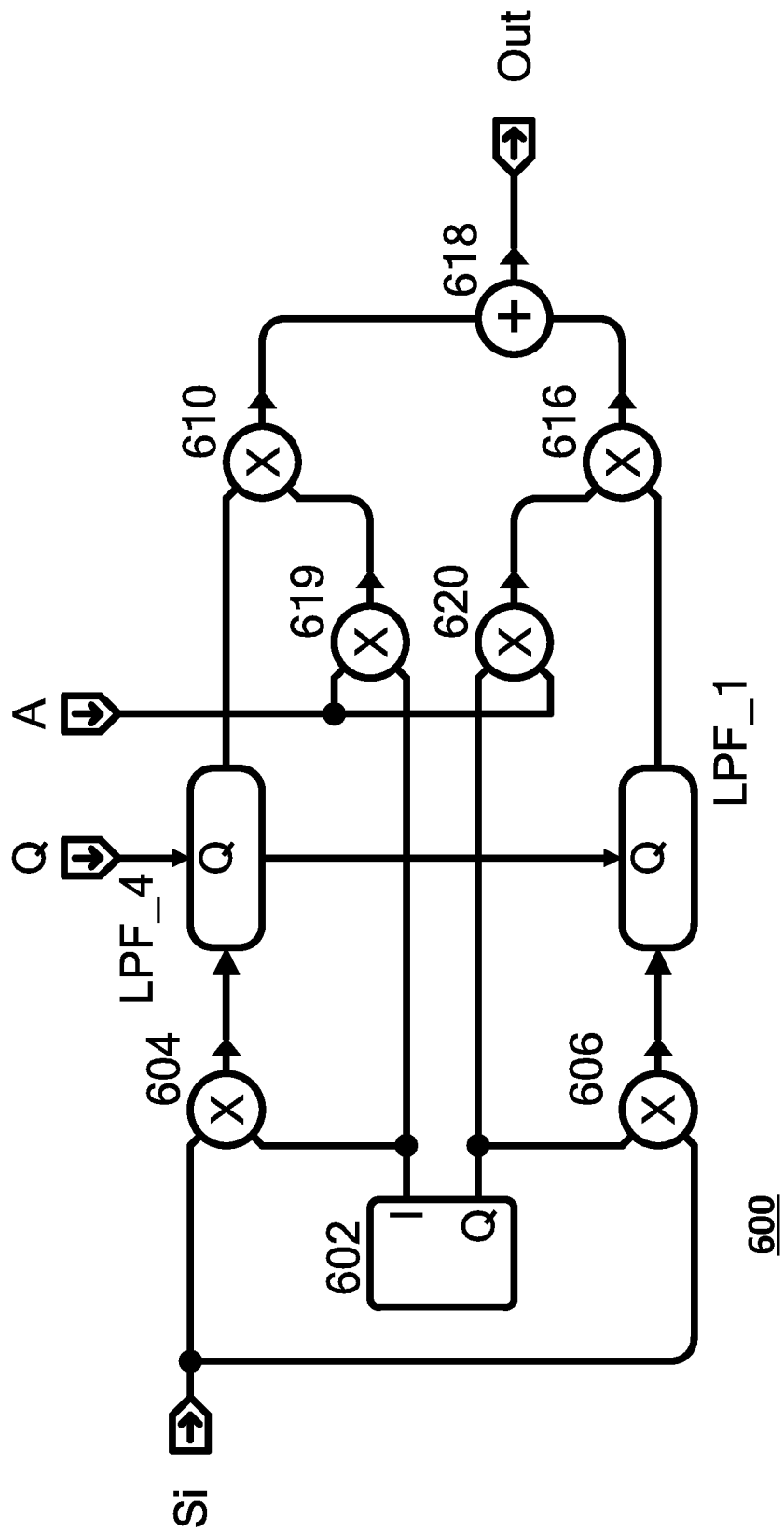
FIG. 6 is a block diagram of a circuit that may be used as one channel of an equalizer in which the amplitude of the resynthesized signal may be controlled in an alternative embodiment.

If, as will typically be the case, the second quadrature source 501 is of the same frequency as the first quadrature source 502, a similar result to that of circuit 500 may be obtained in a slightly different way as shown by circuit 600 in FIG. 6. Circuit 600 omits a second quadrature source, and instead adds multipliers 619 and 620 to multiply the I and Q signals from quadrature source 602 by a gain A. These signals are then multiplied by the signals from low pass filters LPF_1 and LPF_4 in multipliers 610 and 616, and then summed in adder 618 in similar fashion to circuit 500.

As in the prior art, once a circuit has been selected for a single channel, a plurality of such circuits, each operating in a different frequency band, can be placed in parallel to make an equalizer, as equalizer 100 of FIG. 1 may be constructed of 8 instances of circuit 200 of FIG. 2.

Figure 7:
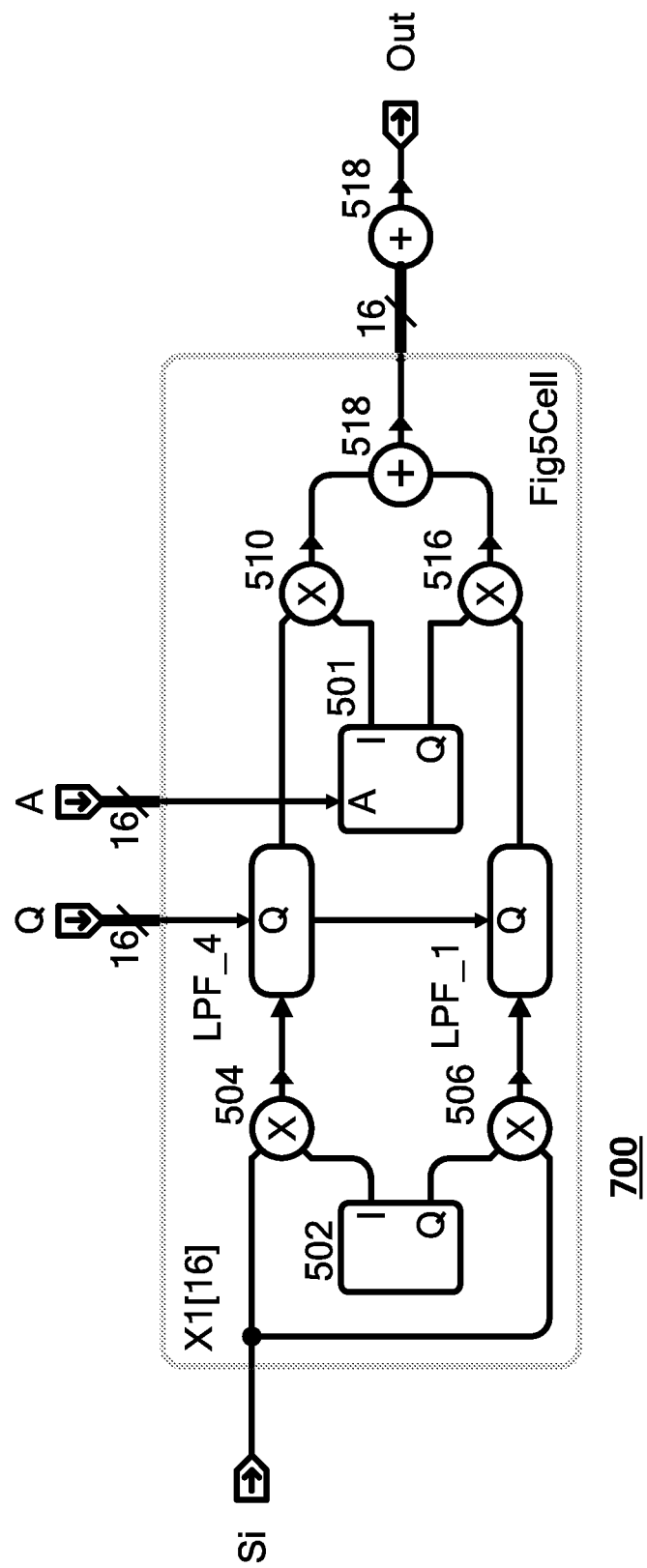
FIG. 7 is a block diagram of an equalizer comprised of a plurality of circuits as shown in FIG. 5.

Similarly, a plurality of the circuits shown in FIG. 5 or 6 may be used to make an equalizer. FIG. 7 is a block diagram of an equalizer comprised of a plurality of circuits 500 as shown in FIG. 5. In this instance, circuit 700 is shown as having 16 channels, each again operating in a different frequency band. All of the outputs of the 16 channels are summed to create a final single output Out. However, each channel has a separate Q control for the low pass filters and a separate gain control for the second quadrature source. When constructed this way, circuit 700 is a 16-band, or 16-channel, equalizer.

The described circuit architecture allows for additional functionality. An audio compression and expansion circuit (or "compandor") operates to increase the amplitude of a signal when the signal is low, and to suppress the signal when the signal is high. This is sometimes done, for example, to make an audio signal sound louder, to provide more bass response or to prevent damage to a loudspeaker at a resonant frequency or due to high temperature. For example, signals in the region of 50 to 300 Hz may be expanded, so as to emphasize the bass notes in a piece of music. In particular, companding is often done to obtain a more "pleasing" sound through small loudspeakers, such as those used in or with smartphones and other mobile devices.

Figure 8:
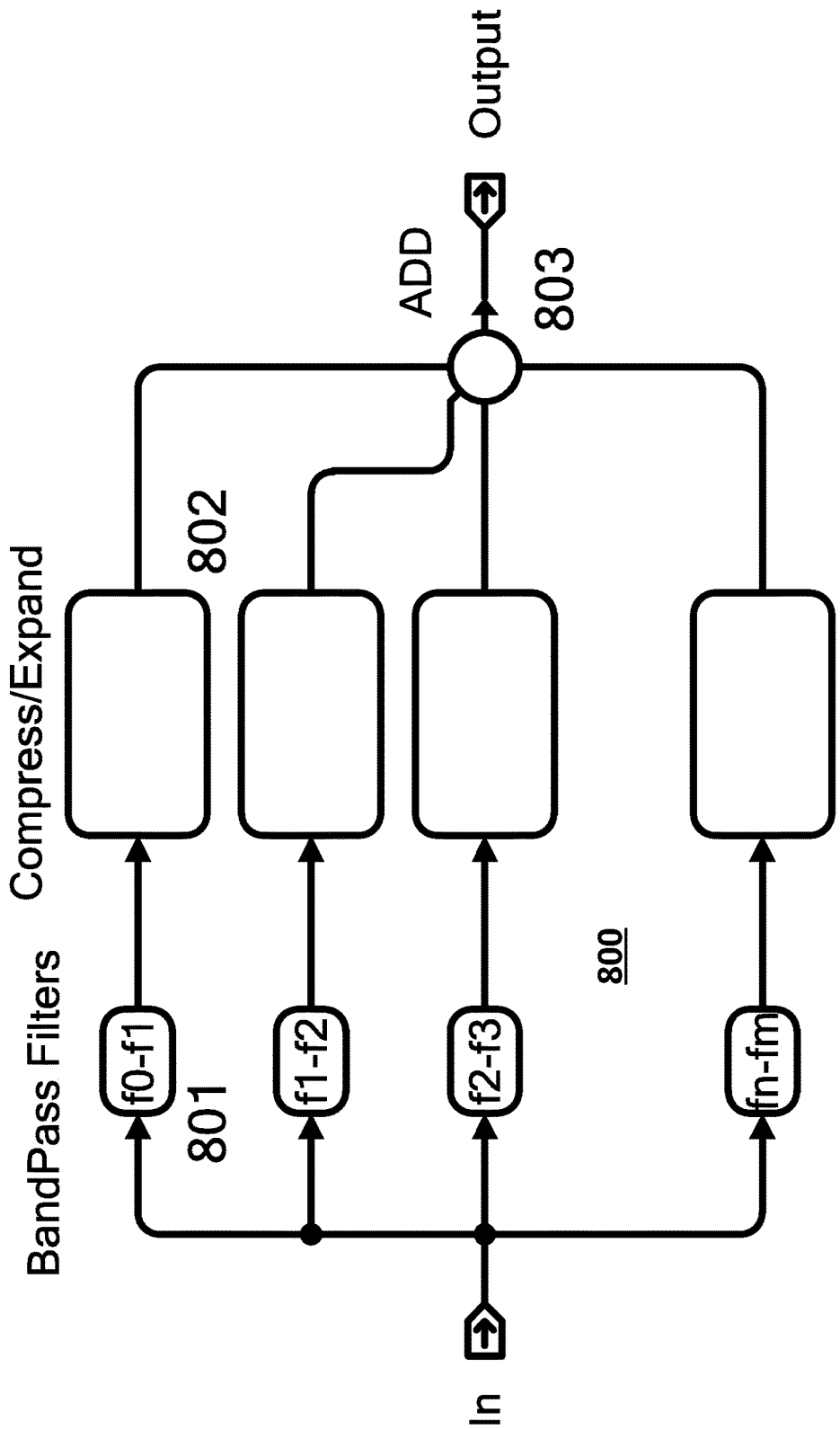
FIG. 8 is a block diagram of a compandor according to the prior art.

In the prior art, companding is performed on separate frequency bands, in a similar fashion to equalization. For example, FIG. 8 is a block diagram of a companding circuit 800 according to the prior art. As with the separate channels of an equalizer as described above, in companding circuit 800 different frequency bands, or channels, are each defined by a pair of band pass filters f0 and f1, f1 and f2, f2 and f3, up to fn and fm. In this example, the upper limit of one frequency band is the lower limit of the next frequency band, so that, for example, pass filter f1 defines the top of a first frequency band the bottom of the next frequency band. However, while FIG. 8 shows a common frequency for each two adjacent bands, this is an illustration of functionality of the various elements; it will be appreciated that the physical circuits need not be placed in any particular order as their function will not change with their physical orientation.

Each frequency band contains a compandor, i.e., a compress/expand component, 802, to which the signal in that frequency band is fed, and that compresses or expands (i.e., increases or decreases) the signal in that frequency band. The outputs of all of the compandors 802 are summed by adder 803 to provide the Output of the companding circuit 800.

Figure 9:
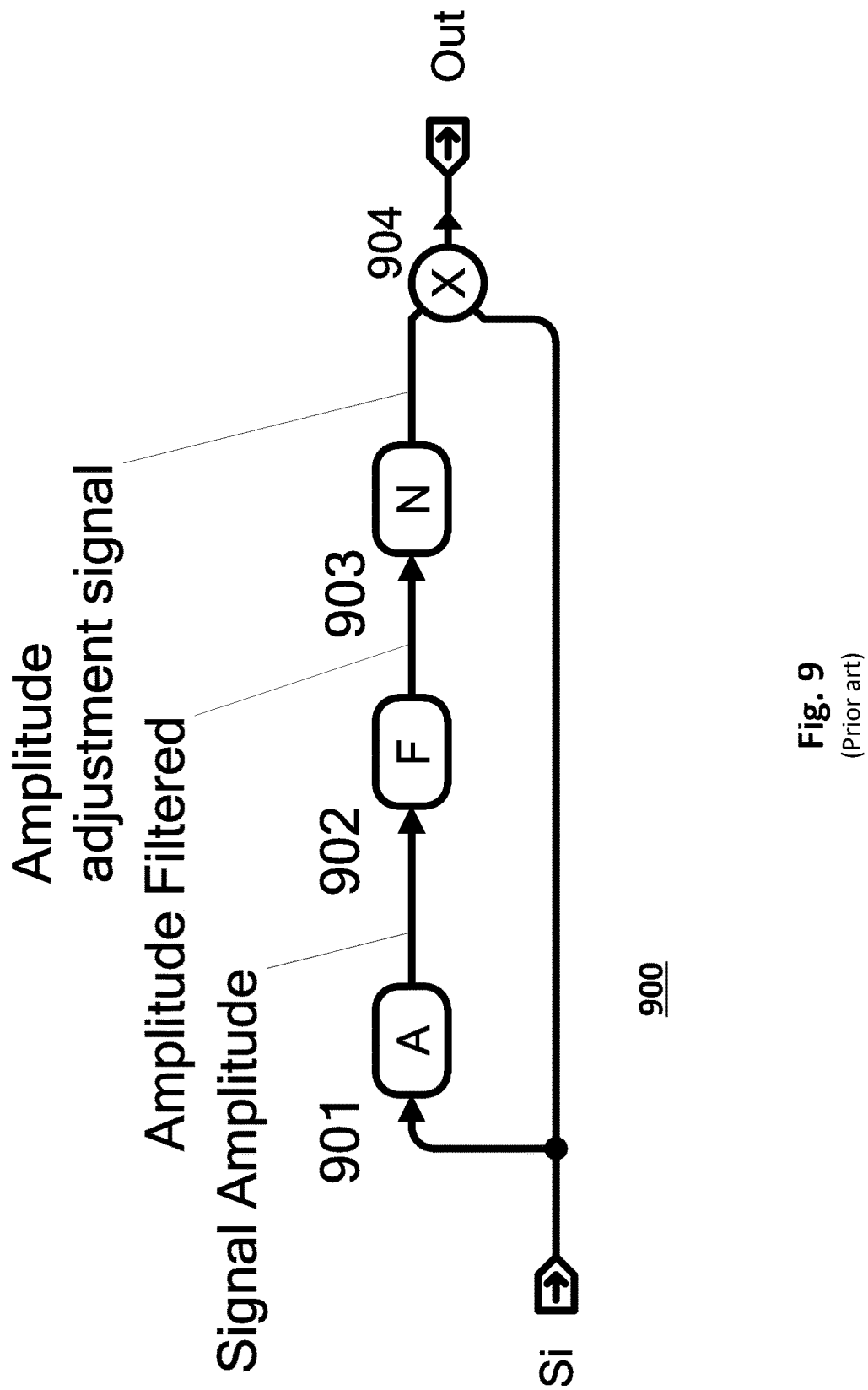
FIG. 9 is a block diagram of a portion of the compandor of FIG. 8 according to the prior art.

Each compandor 802 consists of several elements as shown in compandor 900 of FIG. 9. A first element 901 assesses the amplitude of the signal. The signal amplitude is then filtered by a filter 902 that has differing "attack" and "decay" responses, i.e., differing responses to a rising input signal and a falling input signal, respectively; these are well known in the art.

The actual companding is performed by a compression/expansion element 903 that has a non-linear response to a signal. Typically element 903 has a certain nominal gain that is greater than 1, so that the output Out of the compandor is greater than the input Si. However, this nominal gain is modified by the filtered amplitude signal that element 903 receives from filter element 902. In general, for signals of filtered amplitudes less than a preset value, the gain of element 903 is greater than its nominal gain, increasing the gain to the output, while for signals of filtered amplitudes greater than the preset value, the gain of element 903 is less than its nominal gain, decreasing the gain to the output.

Figure 10:
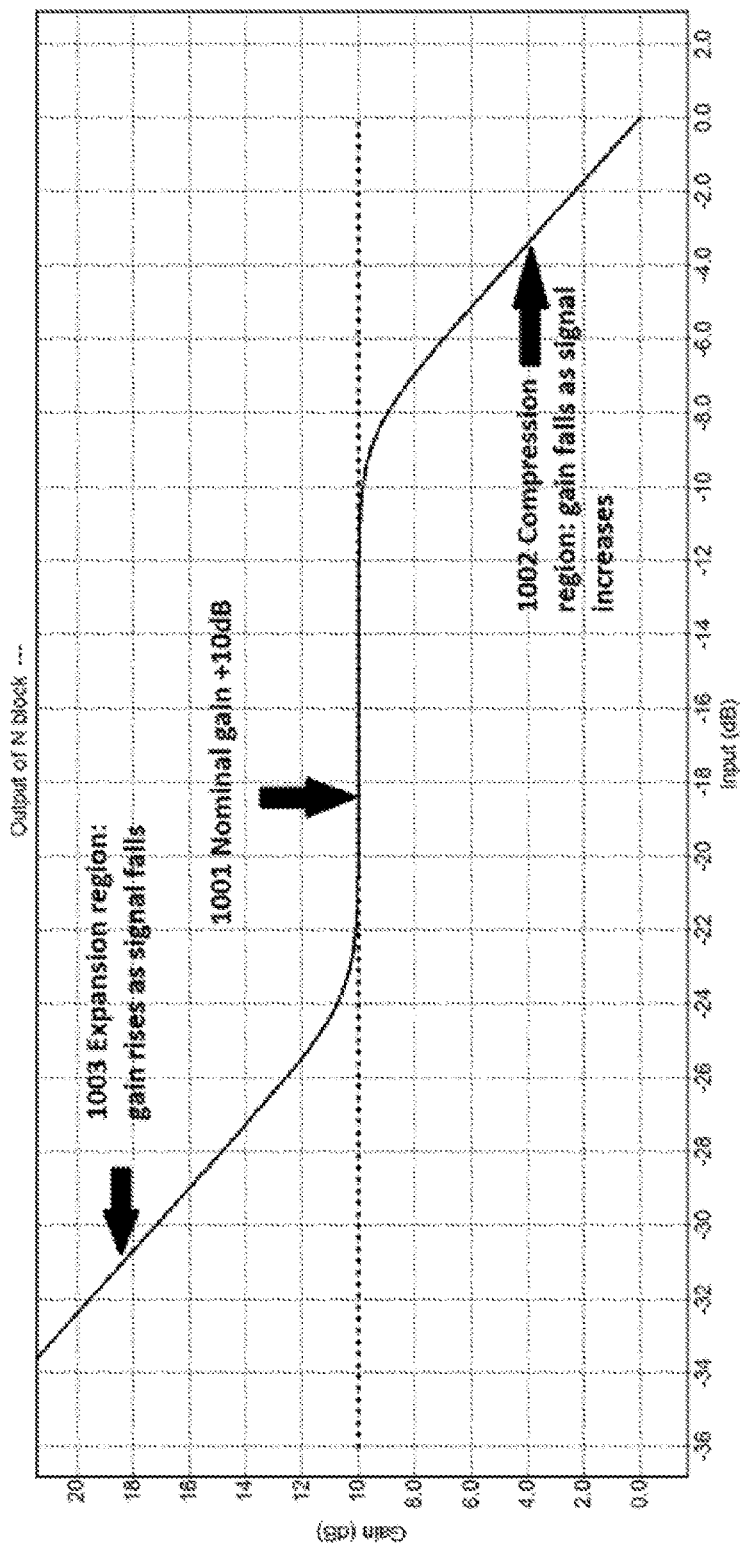
FIG. 10 is a graph of the non-linear gain of a compandor such as might be found in the prior art.

FIG. 10 shows a graph of one example of the performance of a non-linear element 903 that might be found in the prior art. In FIG. 10 the nominal gain is 10 decibels (db), and this nominal gain is applied to input signals that range from about −23 db to −10 db as seen by portion 1001 of the graph of FIG. 10. Thus, all signals in this range are enhanced by 10 db, and will sound louder.

As the input signal gets louder, i.e., above −10 db (portion 1002 of the graph of FIG. 10), the gain is reduced; by the time the input signal is 0 db, there will be no gain and the output signal will also be at 0 db. On the other end, for signals lower than −23 db (portion 1003 of the graph of FIG. 10), the gain is increased; for example, a signal at −32 db will be amplified by about 19 db rather than the nominal 10 db.

It is possible to modify the novel circuit 500 of FIG. 5 so as to include the amplitude measuring function of circuit 400 of FIG. 4, as well as the companding function of compandor 900 of FIG. 9. Circuit 1100 of FIG. 11 shows this modification.

Figure 11:
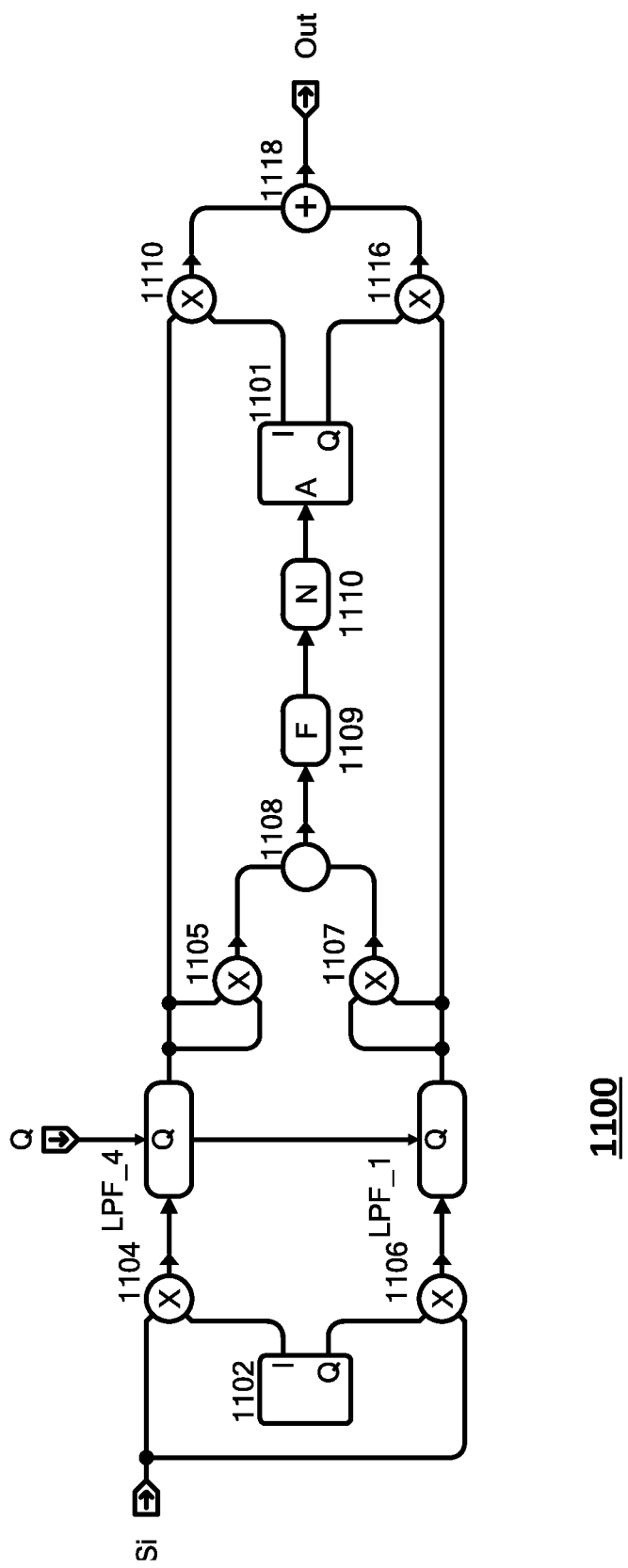
FIG. 11 is a block diagram of a circuit that includes a compandor and may be used as one channel of an equalizer in one embodiment.

In FIG. 11, it may be seen that circuit 1100 contains the elements of circuit 700 of FIG. 7. The first and second quadrature sources 1102 and 1101, low pass filters LPF_4 and LPF_1, multipliers 1104, 1106, 1110, and 1116, and adder 1118 all function as the corresponding components described above with respect to circuit 700.

Circuit 1100 adds the functionality of circuit 400 of FIG. 4 and compandor 900 of FIG. 9. Multipliers 1107 and 1105 in circuit 1100 multiply the outputs of low pass filters LPF_4 and LPF_1 by themselves to obtain the squares of the signals from the low pass filters as do multipliers 410 and 416 in circuit 400 of FIG. 4, and adder 1108 of circuit 1100 adds the squares together as does adder 418 of circuit 400. Multipliers 1107 and 1105 and adder 1108 thus provide a signal, the sum of the squares of the signals from the low pass filters LPF_4 and LPF_1, that indicates the amplitude of the input signal, as does element 901 of circuit 900 of FIG. 9. (It is not necessary to take the square root of the sum of the squares to determine the amplitude of the input signal, although this may be done if desired.)

Circuit 1100 also includes another filter 1109, which performs the same function as filter element 902 of circuit 900 in FIG. 9, and a compandor 1110, which performs the same function as compandor 903 of circuit 900. The output of compandor 1110 is applied to second quadrature source 1101 as an input; if it is high, the amplitudes of I and Q from second quadrature source 1101 will be high, and if it is low, the amplitudes of I and Q from second quadrature source 1101 will be low. Thus, the function of multiplier 904 in circuit 900 of FIG. 9 is performed by using compandor 1110 to adjust the amplitude of the second quadrature source 1101, and another multiplier is not needed. In addition, compandor 1110 can also control the phase of the I and Q signals from second quadrature source 1101. Phase control may be useful, for example, in preventing the phase of the signals from any given band from aligning with another band in a constructive fashion, thus adding so much amplitude to the output signal Out so as to cause over-excursion in the loudspeaker, while still maintaining the quality of the output audio signal.

Figure 12:
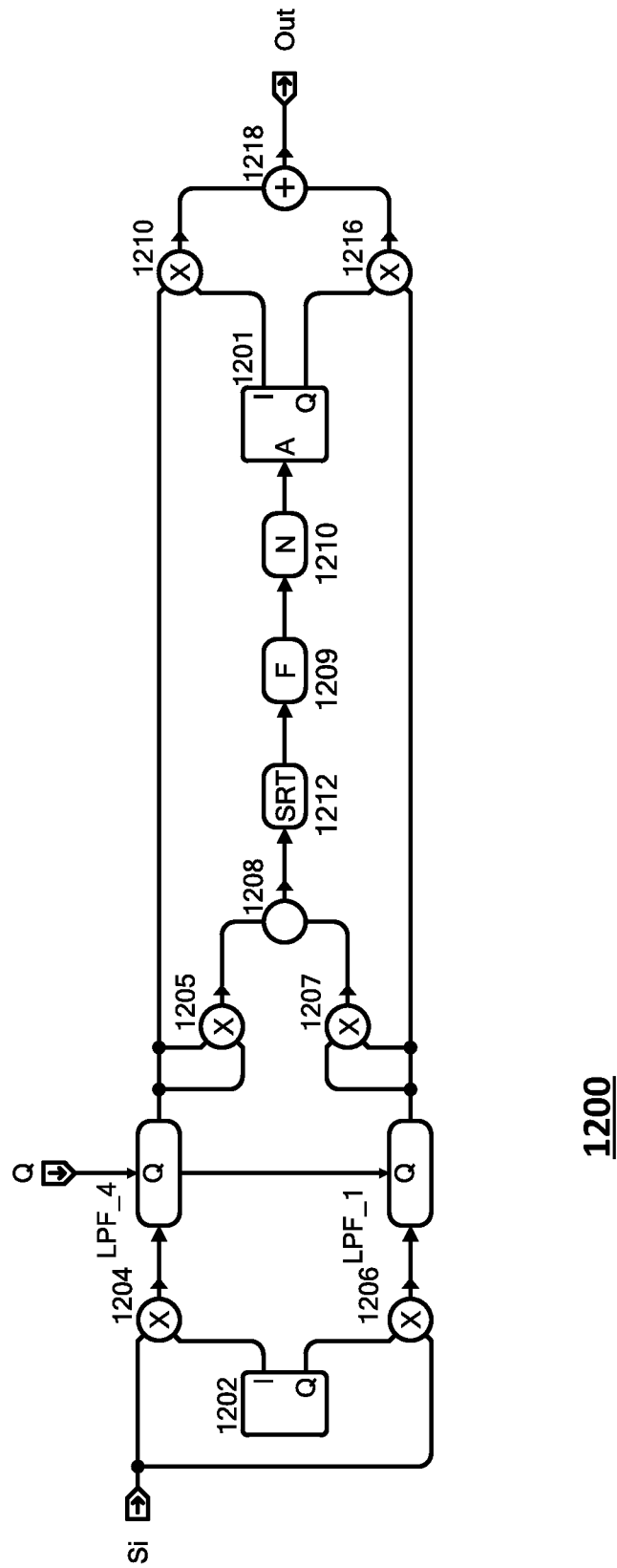
FIG. 12 is a block diagram of a circuit that includes a compandor and may be used as one channel of an equalizer in another embodiment.

FIG. 12 is a block diagram of a circuit 1200 that is an alternative embodiment to that of circuit 1100 in FIG. 11. As mentioned above, it is not necessary to take the square root of the summed squares of the outputs from the low pass filters. However, if it is desired to do so, this is easily accomplished by adding a square root calculator element 1212 after the squares are summed and before the filter 1209 in the companding portion of circuit 1200.

Circuits 1100 and 1200 are distinguishable from the prior art, since the compandor is now located before the resynthesis of the signal of each frequency band. This allows the compandor access to the input signal as a quadrature signal, i.e., a representation of the input signal as a vector quantity (sometimes called a "phasor"), which as above allows an improved assessment of the instantaneous amplitude of the input signal as compared to the prior art, which must accommodate the zero crossings of the signal (and thus requires a differently optimized amplitude assessment filter for each different frequency band). In addition, prior art compandors only provide for adjustment of the amplitude of the signal, while as above the described embodiment also allows for adjustment of phase (and even frequency).

Multiple instances of circuit 1100 of FIG. 11 (or circuit 1200 of FIG. 12) may be placed in parallel, similarly to the examples of FIGS. 1 and 2 of the prior art, and circuit 700 of FIG. 7, with each separate circuit operating on a different frequency band, to make a novel multi-band compandor. By adding an additional input, as below, an equalizer can also be similarly constructed. Any arbitrary number of frequency bands may be used.

Figure 13:
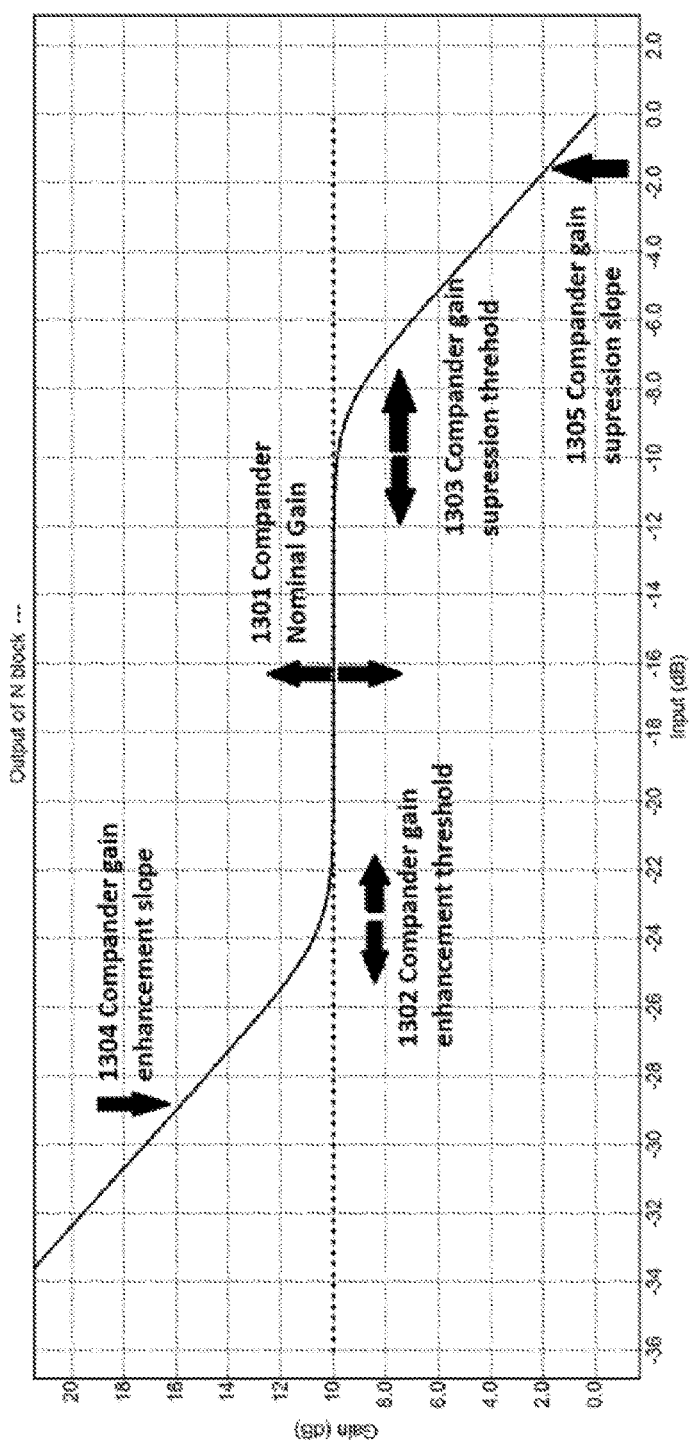
FIG. 13 is a graph of the non-linear gain of a compandor showing where the adjustments may be made according to one embodiment.

FIG. 13 is a graph of the non-linear gain of a compandor showing where the adjustments may be made according to one embodiment. The graph of FIG. 13 is of the same general shape as the graph of the gain of a compandor of the prior art as shown in FIG. 10. However, with a circuit such as circuit 1100 or circuit 1200, the various parameters of the non-linear gain may be controlled.

Thus, as shown by portion 1301 of the graph of FIG. 13, while the nominal gain of the compandor is again shown as 10 db, this may be adjusted either up or down, i.e., to more or less than 10 db, for signals in the center range of loudness. As shown by portions 1302 and 1303 of the graph, the thresholds of the input signal loudness at which the compandor provides gain that is greater or less than the nominal gain, respectively, may be adjusted, allowing for enhancement or suppression of the nominal gain over either a greater or smaller range of loudness as desired. Finally, as shown by portions 1304 and 1305 of the graph, the slope of the gain enhancement and gain suppressions portions of the gain curve, respectively, may be altered, so that input signals below and above the respective loudness thresholds receive more or less gain enhancement or suppression, respectively, as desired.

In this way, the non-linear gain portion of the compandor may be completely adjusted and controlled for each separate frequency band. This allows for alteration of an input signal to protect a loudspeaker when, for example, the loudspeaker temperature is too hot, or the loudspeaker is moving too much because the input signal is at or near a resonant frequency of the loudspeaker.

This provides much more control and flexibility than is presently available. For example, typical compandors currently available for use in smartphones are limited to three frequency bands, one around the resonant frequency of the loudspeaker, one above that resonant frequency, and one below that resonant frequency. Companding is typically only performed in the band around the resonant frequency of the loudspeaker. The architecture described herein allows for similar adjustments and much more. In some embodiments, audio signals may be altered to adapt to the environment, for example, increasing the signal level in the frequency band around ambient noise such as an automobile or airplane engine, to allow the user to better hear the audio signal.

Figure 14:
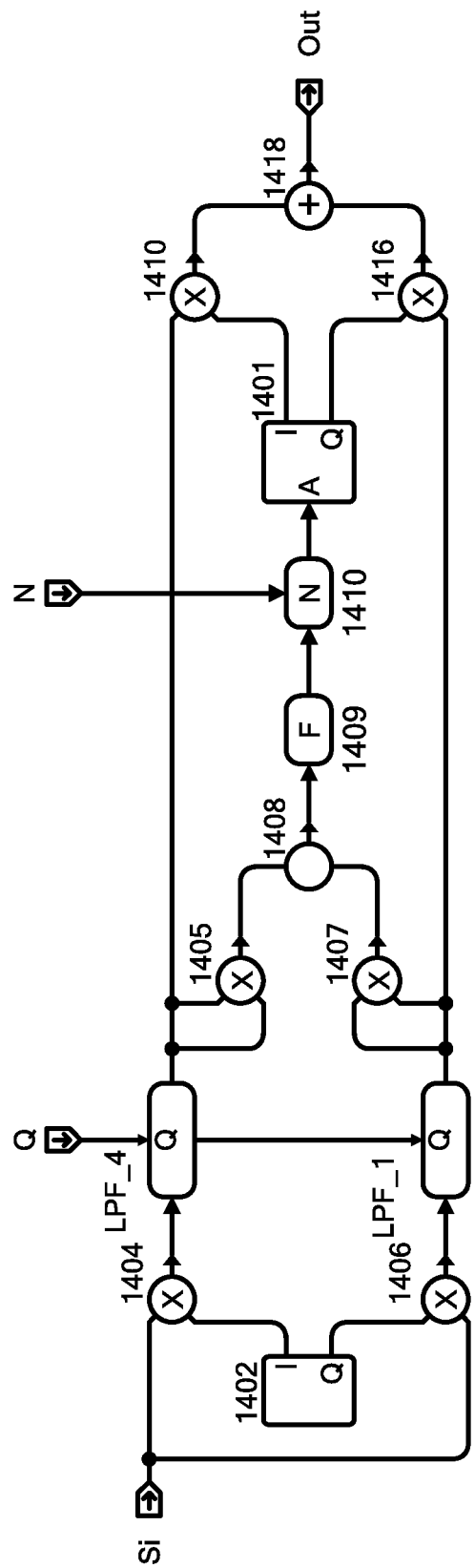
FIG. 14 is a block diagram of a circuit that includes an adjustable compandor and may be used as one channel of an equalizer in another embodiment.

FIG. 14 shows the modification of circuit 1100 of FIG. 11 that may be made in order to allow the adjustments shown on the graph of FIG. 13. Non-linear compression/expansion element 1410 now receives as an input a control signal N that adjusts the various parameters of the non-linear function of the element. The control signal N allows for use of circuit 1400 as one frequency band of an equalizer, as it provides a means for a user to adjust both the nominal gain of the circuit and the flatness of the curve of gain versus frequency to tailor the audio in a way that "sounds best" to the user.

Figure 15:
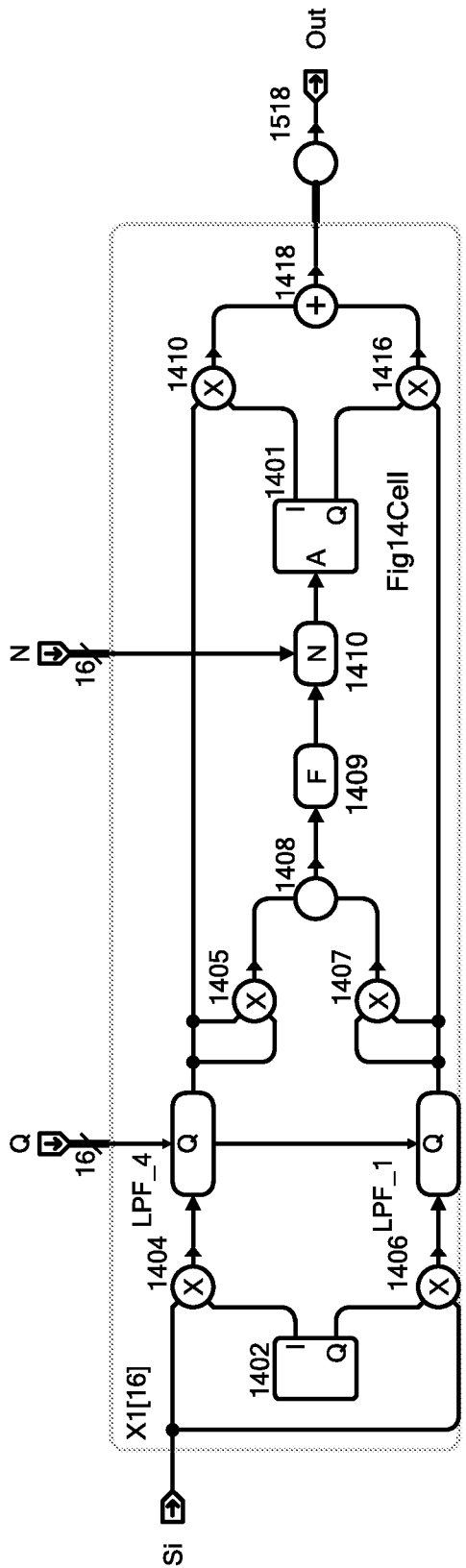
FIG. 15 is a block diagram of an equalizer comprised of a plurality of circuits as shown in FIG. 14.

FIG. 15 is a block diagram of an equalizer comprised of a plurality of circuits as shown in FIG. 14. As with the examples of FIGS. 1 and 2 of the prior art, and circuit 700 of FIG. 7, this is accomplished by using a plurality of circuits 1400, each covering a different frequency band, and each receiving independent signals Q to the low pass filters and control signal N to the non-linear compression/expansion elements 1410.

Figure 16:
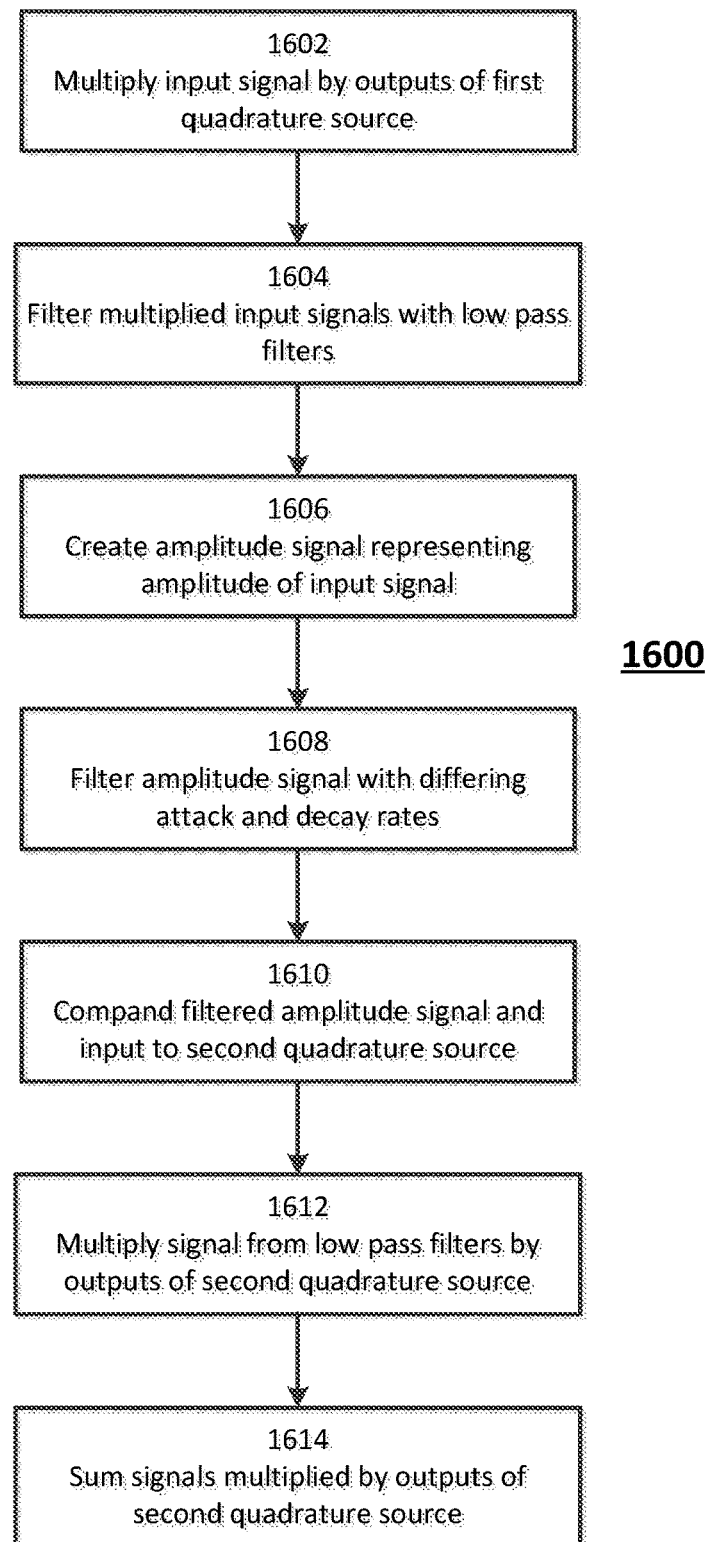
FIG. 16 is a flowchart of a method of processing an input audio signal according to one embodiment.

FIG. 16 is a flowchart of a method 1600 of processing an input audio signal according to one embodiment. At step 1602 the input signal is multiplied by the I and Q outputs of a first quadrature source. This is done, for example, by multipliers 1404 and 1406 of FIG. 14, using the outputs of quadrature source 1402.

At step 1604, the input signal as multiplied by the outputs of the first quadrature source are filtered by low pass filters, such as low pass filters LPF_1 and LPF_4 in FIG. 14.

Steps 1606 to 1610 are not necessary if the method is only intended to process the signal in one channel of an equalizer. However, these steps are included if the audio signal processing is to include companding, and if the circuit is provided to do so. At step 1606, an amplitude signal is created that represents the amplitude of the input signal. This may be done, for example, by squaring the filtered signals from the low pass filters LPF_1 and LPF_4, by multiplying them by themselves, and then summing the two signals by adder 1408 as shown in FIG. 14.

Next, at step 1608, the amplitude signal is filtered by a filter, such as filter 1409 in FIG. 14, that may have differing attack and decay rates. Following this, at step 1610 the filtered amplitude signal is companded using a non-linear gain function, for example by non-linear element 1410 in FIG. 14, and the result passed as an input to the second quadrature source 1401.

At step 1612, the filtered input signals from the low pass filters are multiplied by the I and Q outputs of the second quadrature source, for example, quadrature source 1401 in FIG. 14. As above, if companding is included, the second quadrature source receives a companded amplitude signal from the companding portion of the circuit, which allows for adjustment of both the gain applied by the compandor and the phase of the output of the second quadrature source.

Finally, at step 1614 the results of the multiplication by the outputs of the second quadrature source are summed, for example, by adder 1418 in FIG. 14, to obtain the output signal.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, while the intended use the described circuit and method is in a small loudspeaker driver, such as might be used in a smartphone or other mobile device, it will be apparent to one of skill in the art in light of the teachings herein that it may also be used with any audio system in which an equalizer, including a graphic equalizer, or multi-band compandor is desirable.

Where elements are shown as connected, they may in some embodiments be coupled to each other through another element or component. One of skill in the art will also appreciate how to determine parameters of the components depending on other components in the smartphone or mobile device.

These and other variations upon the embodiments are intended to be covered by the present disclosure, which is limited only by the appended claims.

What is claimed is:

1. A method of processing an audio input signal, comprising:
   multiplying the input signal by I and Q outputs of a first quadrature source;
   passing the input signal multiplied by the I output of the first quadrature source through a first low pass filter and the input signal multiplied by the Q output of the first quadrature source through a second low pass filter;
   multiplying an output of the first low pass filter by an I output of a second quadrature source and an output of the second low pass filter by a Q output of the second quadrature source, the second quadrature source having a different phase and amplitude than the first quadrature source, but the same frequency; and summing the outputs of the low pass filters multiplied by the outputs of the second quadrature source to provide an output signal.

2. The method of claim 1 wherein the first and second low pass filters have adjustable Q factors.

3. The method of claim 1 further comprising companding the outputs of the first and second low pass filters and providing a resulting companded signal as an input to the second quadrature source.

4. The method of claim 3 further comprising:
creating an amplitude signal representing the amplitude of the input signal;
filtering the amplitude signal;
companding the filtered amplitude signal using a non-linear gain function; and
providing the companded signal as an input to the second quadrature source.

5. The method of claim 4 wherein filtering the amplitude signal further comprises filtering the amplitude signal with a filter having differing attack and decay rates.

6. An apparatus for processing an audio input signal, comprising:
a first quadrature source producing I and Q outputs;
first and second multipliers for multiplying the input signal by the I and Q outputs of the first quadrature source, respectively;
first and second low pass filters for filtering the input signal multiplied by the I output of the quadrature source and the input signal multiplied by the Q output of the quadrature source, respectively;
a second quadrature source producing I and Q outputs;
third and fourth multipliers for multiplying an output of the first low pass filter by the I output of the second quadrature source and an output of the second low pass filter by the Q output of the second quadrature source, the second quadrature source having a different phase and amplitude than the first quadrature source, but the same frequency; and
an adder for summing the outputs of the low pass filters multiplied by the outputs of the second quadrature source to provide an output signal.

7. The apparatus of claim 6 wherein the first and second low pass filters are configured so that their Q factors are adjustable.

8. The apparatus of claim 6 further comprising a circuit for companding the outputs of the first and second low pass filters and providing a resulting companded signal as an input to the second quadrature source.

9. The apparatus of claim 8 further comprising:
fifth and sixth multipliers for multiplying outputs from the first and second low pass filters by themselves to provide an amplitude signal representing the amplitude of the input signal;
a third filter for filtering the amplitude signal;
a compandor for companding the filtered amplitude signal using a non-linear gain function.

10. The apparatus of claim 9 wherein the filter for filtering the amplitude signal has differing attack and decay rates.

\* \* \* \* \*